Dec. 15, 1959 H. R. SMITH ET AL 2,917,712

BROAD BAND TUNED AMPLIFIER CIRCUIT

Filed Sept. 30, 1952 4 Sheets-Sheet 1

INVENTORS.
HARRY R. SMITH
ALLEN R. TAYLOR
BY

INVENTORS.
HARRY R. SMITH
ALLEN R. TAYLOR
BY

Dec. 15, 1959 H. R. SMITH ET AL 2,917,712

BROAD BAND TUNED AMPLIFIER CIRCUIT

Filed Sept. 30, 1952 4 Sheets-Sheet 3

INVENTORS.
HARRY R. SMITH
ALLEN R. TAYLOR
BY

Dec. 15, 1959 H. R. SMITH ET AL 2,917,712

BROAD BAND TUNED AMPLIFIER CIRCUIT

Filed Sept. 30, 1952 4 Sheets-Sheet 4

INVENTORS.
HARRY R. SMITH
ALLEN R. TAYLOR
BY

United States Patent Office 2,917,712

Patented Dec. 15, 1959

2,917,712

BROAD BAND TUNED AMPLIFIER CIRCUIT

Harry R. Smith, Verona, and Allen R. Taylor, Belleville, N.J., assignors, by mesne assignments, to Radio Engineering Laboratories, Inc., Long Island City, N.Y., a corporation of New York Application September 30, 1952, Serial No. 312,234

17 Claims. (Cl. 330—56)

This invention relates to broad band tuned circuits used as plate loads in radio frequency amplifiers.

It is a primary object of this invention to provide such a device in which the number of operational controls is reduced to a minimum, thus simplifying operation. This is done by providing primary and secondary coaxial tuned circuit sections adjacent one another. A mutual coupling device and the tuning means for the primary and secondary sections are ganged together for simultaneous operation, but there is provided an adjustable mechanical connection between the mutual coupling device and the tuning means for the primary and secondary coaxial circuit sections.

Another object of the invention is a convenient means for matching the plate impedance of a vacuum tube to a conventional transmission line such as a 51½ ohm coaxial line. The inner element of the primary coaxial tuned transmission line section has means to mount a vacuum tube within the upper portion thereof. The output of the secondary coaxial tuned transmission line section is led downwardly and outwardly through the hollow cylindrical inner conductor thereof by a conventional transmission line, such as a 51½ ohm line having its outer conductor conductively connected to the upper end of said hollow cylindrical inner conductor and its inner conductor connected for radio frequencies to the outer element of the secondary coaxial tuned transmission line.

A further object of this invention is the provision of a broad band tuned circuit of this character in which wide band widths are possible with conventional vacuum tubes. The invention also combines the advantages of coaxial tuned circuits (low losses, stability, excellent shielding, freedom from parasitic oscillations, etc.) with broad band circuit techniques.

It is also an object to provide in such a device an effective path for vacuum tube cooling air. The anode of the vacuum tube is placed within the upper portion of the inner, hollow, cylindrical element of the primary tuned coaxial transmission line section. An open grille is provided in the structure above the vacuum tube, and the inner, hollow, cylindrical element is open at the bottom thereof to provide through passage for cooling air. Still another object is to afford convenient means to apply anode potential to the vacuum tube. This is done by introducing the anode voltage through the lower open end of the inner, hollow cylindrical element of the primary tuned coaxial transmission line section by means of a rod like conductor spaced therefrom and extending upwardly therethrough to make conductive connection with the anode of said amplifier tube.

The invention will be described by reference to the drawings in which.

Figure 1:
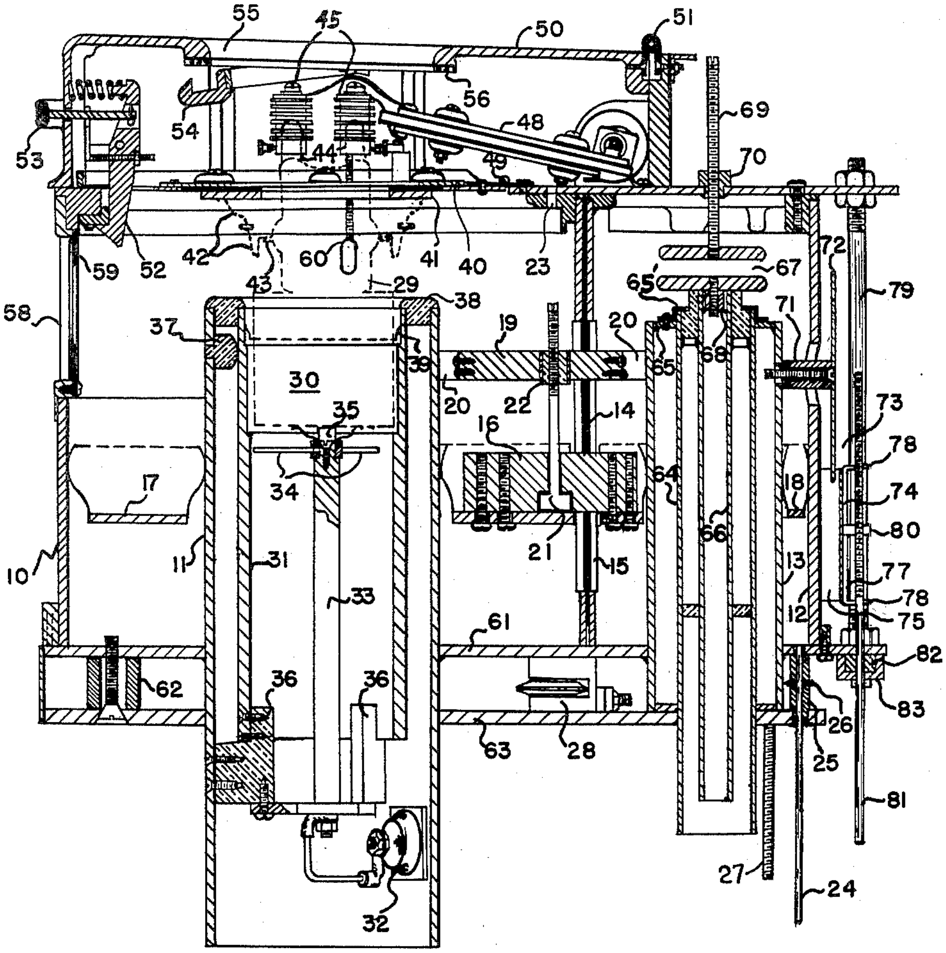
Fig. 1 represents an enlarged vertical cross section of a device embodying the invention.

With reference to Fig. 1 of the drawing, there is shown at 10 the outer element of a primary tuned coaxial transmission line section. The inner element of the primary section is shown at 11. Adjacent the primary section is a secondary tuned coaxial transmission line section, the outer element of which is indicated at 12 and the inner element or conductor at 13. The outer elements or conductors are suitably joined together, as by means of a weld indicated at 14. The walls of the outer conductor of the primary and secondary tuned sections are slit to provide a longitudinal aperture 15 interconnecting the interiors of the two sections. Extending through the aperture 15 is a bar 16 of brass or other suitable material which connects together the shorting rings 17 and 18 of the primary and secondary sections respectively. Also extending through the aperture 15 is a mutual coupling element which consists of a conductive, metallic bar 19 having contact fingers 20 at each end thereof making sliding contact with the inner conductors 11 and 13 of the primary and secondary sections. Held captive by the bar 16 is the head of a screw 21 which threadedly engages an insulating plug of Textolite or other suitable material carried by the bar 19 by means of a brass bushing 22. The shorting rings 17 and 18 and the mutual inductance bar 19 are thus ganged together with means in the form of screw 21 to adjust the spacing between the bar 19 and the shorting rings 17 and 18. The top of the screw 21 may be notched to receive the end of a screw driver which may be inserted through an aperture 23 in the top wall of the primary tuned section.

Figure 2:
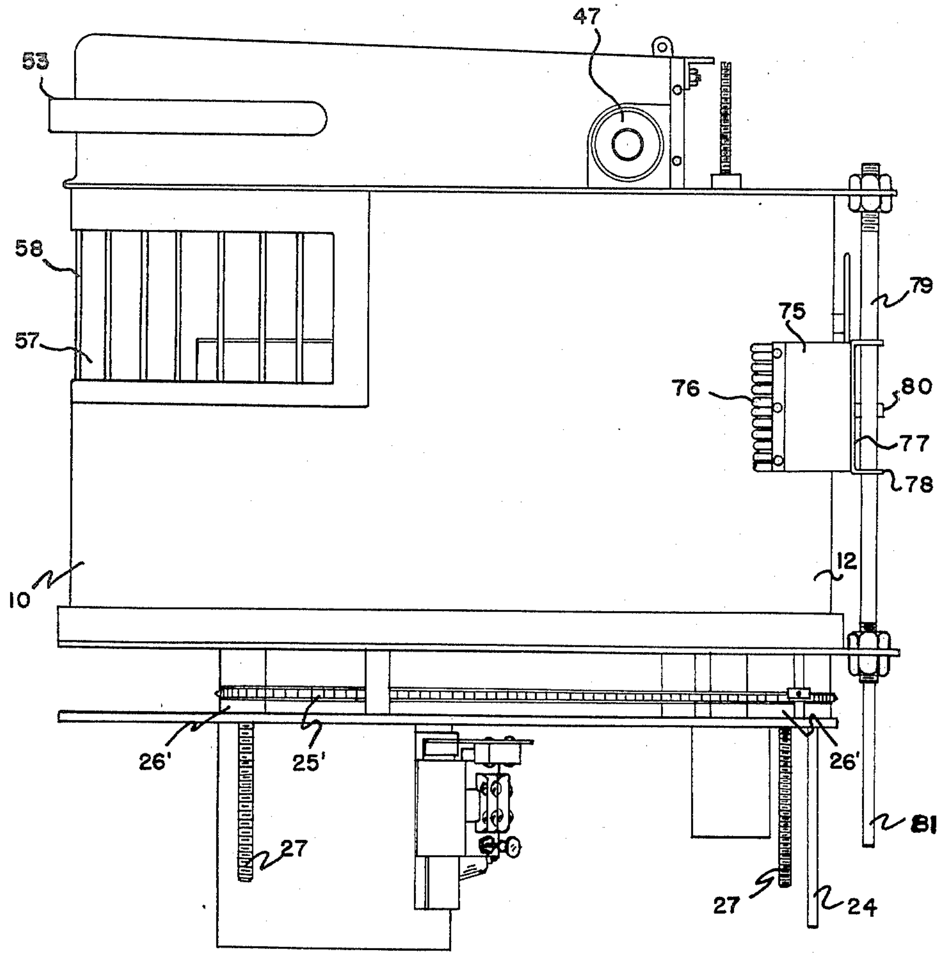
Fig. 2 is a side elevation which corresponds to the vertical cross sectional view of Fig. 1.

The shorting rings 17 and 18 and the bar 19 may be moved in unison by rotation of a chain drive shaft 24 to which is affixed by hub 25 a sprocket 26. A chain 25', Fig. 2, engages the drive sprocket 26 and four similar sprockets each fixed to a threaded hub, two of which are seen at 26', 26', Fig. 2. Each of the threaded hubs 26' receives a threaded stud 27 suitably attached at its upper end to the shorting ring assembly 17, 18. At 28 of Fig. 1 is shown a take up sprocket holder with adjusting means therefor to adjust the slack of chain 25.

Shown in dotted lines at 29, Fig. 1 is the outline of a vacuum tube of conventional design which may be type Ax9904–R. The anode of the tube indicated at 30 is mounted within the upper end of a tubular element 31 which is concentric within the hollow, cylindrical inner conductor element 11 of the primary coaxial tuned section. The tubular element 31 affords an R.F. block, but this function of the element forms no part of the present invention and is not described in detail herein. Anode potential for the tube 29 is introduced by a conductor through the bushing 32 and the shaft 33. The shaft 33 is spaced at its upper end within the tubular element 31 by means of a spider 34. Contact fingers 35 at the upper end of shaft 33 conductively engage the anode 30 of vacuum tube 29. The tubular element 31 is secured within the inner conductor 11 at the bottom by means of three insulating blocks 36, and at the top by three insulating spacers 37 and an insulating ring 38. The insulating ring also serves as an air block so that cooling air for the vacuum tube 29 will be forced to flow within and through the tubular element 31 as will be further described hereinafter. Fingers 39 make contact between the upper end of element 31 and the anode 30 of vacuum tube 29.

Part of the upper wall 40 of the primary tuned coaxial sections forms the upper plate of a condenser, the lower plate 41 of which is connected by contact fingers 42 to the grid connection 43 of vacuum tube 29. The condenser, formed by plates 40 and 41 which may be spaced by a suitable dielectric such as mica, permits the application of grid bias and also permits the grid to be grounded for radio frequencies. Two of the three filament contact stubs 44 are visible in Fig. 1 and these are received in connectors 45.

Figure 3:
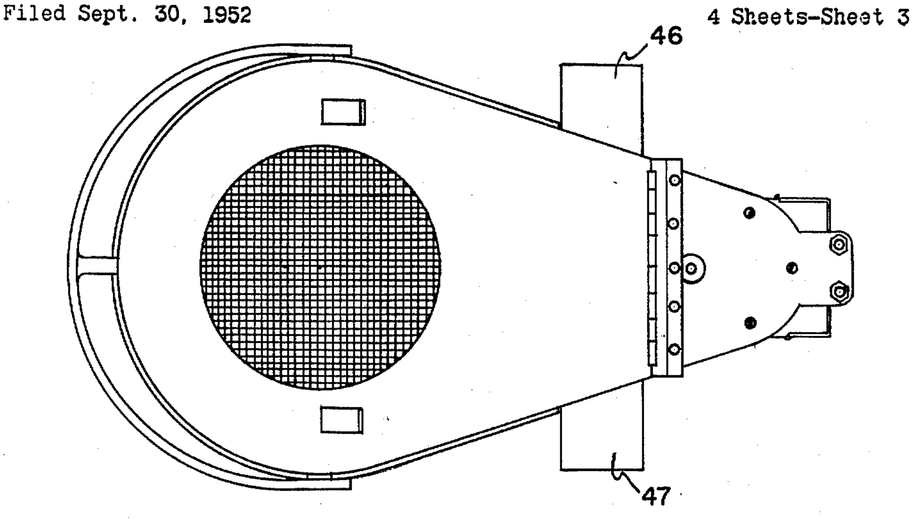
Fig. 3 is a top plan view of the device of Figs. 1 and 2.

The cathode of vacuum tube 29 is driven by a signal applied through a transmission line which extends from the left and right of the top of the tuned circuit structure as shown at 46 and 47 respectively of Fig. 3. The signal is connected from the line 46, 47 to the connectors 45 by means of a capacitive device indicated generally at 48. The device 48 provides a cathode by-pass and a filament by-pass and the entire assembly including the connectors 45 and the capacitive device 48 is pivoted as an arm of a hinge about an axis concentric with the left and right extensions 46 and 47 of the incoming transmission line to permit installation or replacement of vacuum tube 29. However, this invention is not concerned with the feature of feeding the signal to the tube 29 and hence the details thereof will not be described herein.

The plate 40, which forms the upper wall of the primary tuned coaxial section, is hinged at 49 which also permits installation and replacement of vacuum tube 29. There is further provided a cover 50 hinged at 51 for that purpose. A latch 52 for the cover has a handle 53. A latch 54 is provided to hook the grid plate 40 back out of the way when replacing or installing a vacuum tube.

The cover 50 has an opening 55 therein to the edges of which may be affixed a suitable screen 56. Also, the upper side wall 10 of the primary tuned coaxial element may have an opening therein extending partially therearound as shown at 57 of Fig. 2 and in which may be mounted a grill 58. Behind the grill 58 is provided a polystyrene sheet 59 which limits air flow through opening 57 and thus forces some of the cooling air flow to enter through the opening 55 in the top 50 and to flow past grid fingers 42 and thus cool the grid seal of vacuum tube 29. The opening in top plate 40 will be seen in Fig. 1 to be larger than the outer dimension of vacuum tube 29 at that plane for the purpose of admitting the cooling air for the grid seal above referred to.

A neutralizing stub and tip is shown at 60. This element provides a small amount of R.F. feedback from output to input (from plate to filament). The depth to which the probe extends below the plane of the grid is adjusted to neutralize the amplifier. There is thus provided a capacitive feedback which, in conjunction with the series grid inductance, is adjusted so that the output signal does not interact with the input signal. The contact fingers or straps 42 of which there are four connect the grid of the vacuum tube to ground and are designed to give in combination with the inner grid structure of vacuum tube 29 approximately the correct value of series grid inductance. The analysis of this method of neutralizing is not given in detail since it is not the subject of this invention.

The bottom wall of the primary and secondary coaxial tuned sections is indicated at 61 and connected thereto by spacers, one of which is shown at 62 is a plate 63 which retains the sprocket hubs 25.

At the top of the inner conductor 13 of the secondary coaxial tuned section there is conductively connected the outer conductor 64 of a transmission line, such as a conventional 51½ ohm line, by means of ring 65 and cap 65'. To the top of the inner conductor 66 of the transmission line there is conductively connected the fixed plate of an adjustable air coupling capacitor 67 by means of threaded metal plug 68. The movable upper plate of coupling condenser 67 is carried by a shaft 69 which threadedly engages bushing 70 in the upper wall of the secondary coaxial tuned section.

The output from the broad band tuned circuit is led downwardly and outwardly through the inner conductor of the secondary tuned coaxial section by the 51½ ohm transmission line 64, 66 to a load such as an antenna or a succeeding amplifier.

Also conductively connected to the upper end of inner conductor 13 of the secondary coaxial tuned section is one end of an inductance element 71 which in the example of the invention shown in Fig. 1 takes the form of a metal tube. At the other end of the tube 71, which extends through an aperture in the outer conductor 12 of the secondary coaxial tuned circuit section, is the fixed plate 72 of a variable condenser 73. The series combination of inductance 71 and condenser 73 is designed and adjusted to be the equivalent of the series grid inductance and the grid to plate capacity respectively of vacuum tube 29. This design and adjustment causes the primary and secondary coaxial tuned sections to track. That is to say, the open end conditions on the primary and secondary sections being similar, resonant frequency of primary and secondary sections will be equal to one another at all settings of the shorting rings 17 and 18. To achieve suitable tracking conditions it is also necessary to properly adjust output coupling condenser 67 to approximate the capacitive effect including grid plate capacitance of vacuum tube 29 between the inner conductor 11 and the upper plate 40 of the primary coaxial tuned section. The movable plate of condenser 73 is shown at 74 and has flanges 75 at the sides thereof which carry contact fingers 76 thereon to make sliding connection with outer conductor 12 of the secondary coaxial tuned circuit section. A bracket 77 is connected to the back of plate 74 of condenser 73. The bracket has flanges 78 through which pass a pair of condenser plate guide shafts 79. The bracket also carries a threaded block 80 which threadedly receives a tuning shaft 81. The tuning shaft 81 has fixed thereto a collar 82 as by means of a set screw and the collar is held captive by means of a cap 83 secured to bottom wall 61.

It should be clear that in the embodiment of the invention shown the inductance device 71 conveniently took the form of a collar having a selected diameter. It may be necessary in other devices embodying the principles of this invention to have this inductance take another form as for example, a hairpin loop in order to obtain proper inductance.

Figure 4:
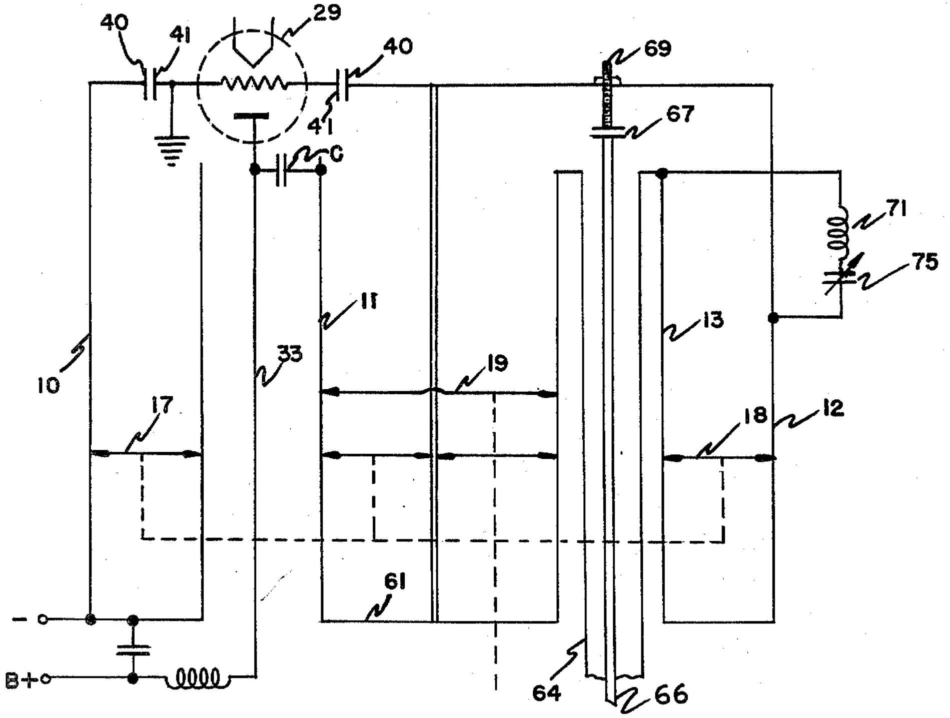
Fig. 4 is a simplified showing of the essential structural and electrical components of Fig. 1.

Referring now to Fig. 4 for an understanding of the general principles of the invention, the reference numerals applied to the simplified structure correspond to those found detailed in Fig. 1. It is clear that the device comprises two coaxial tuned R.F. circuit sections side by side having outer conductors 10, 12 and inner conductors 11, 13. Condenser C of Fig. 4 is an R.F. bypass condenser connecting the anode of vacuum tube 29 to the inner conductor 11 of the primary section formed by the capacity effect between the inner conductor 11 of the primary coaxial tuned section and the inner tubular element 31 shown in Fig. 1, which is conductively connected to the anode of vacuum tube 29.

Figure 5:
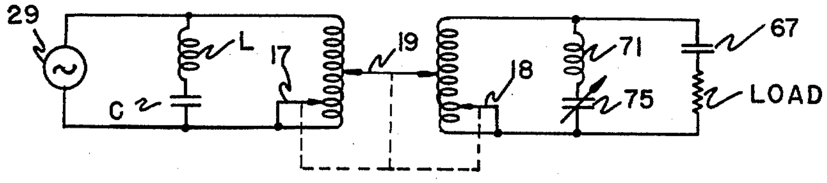
Fig. 5 is a simplified schematic showing of the equivalent circuit with respect to Figs. 1 and 4.

The elements shown in Fig. 4 constitute an "over coupled" circuit whose schematic equivalent is shown in Fig. 5 wherein the reference numerals correspond to those in Figs. 1 and 4. Condenser C, represents the grid to plate capacity of vacuum tube 29. Inductance L represents the series grid inductance of vacuum tube 29.

Figure 6:
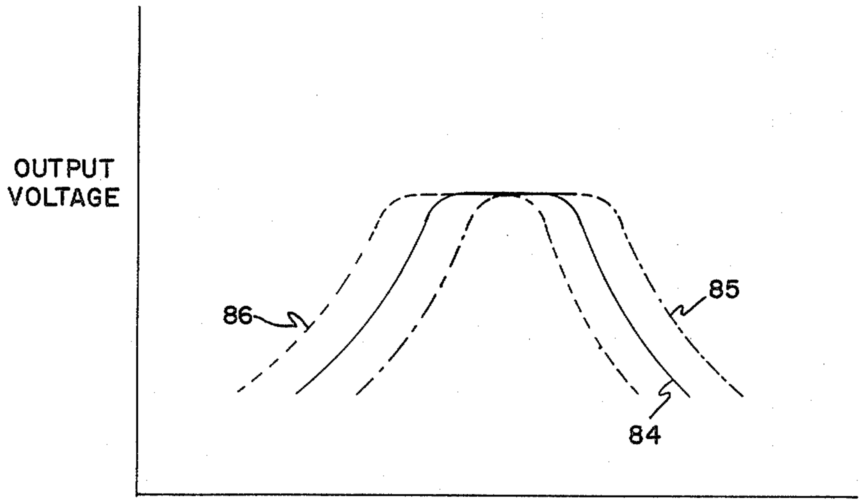
Fig. 6 is a graph showing the effect of varying the control settings on the frequency response characteristic of the invention.

The frequency response characteristic of a properly adjusted over coupled circuit according to this invention is shown in Fig. 6 at 84 by the curve in solid lines. Curve 85 represents the effect of setting tuning control for a higher frequency and curve 86 shows the effect of setting the tuning control lower in frequency. Over small frequency ranges the degree of coupling (both mutual and output) can be considered constant and the effect is merely to move the pass band of frequencies higher or lower in frequency, all other conditions such as tilt, band width and band pass shape remaining essentially constant.

We claim:

1. A broad band tuned circuit comprising two tunable coaxial circuit sections adjacent one another, means for supporting an amplifier tube in the upper end of the inner coaxial element of one of said sections, an adjustable shorting ring for the inner and outer elements of each of said coaxial circuit sections, said shorting rings connected together to move as a unit, an adjustable mutual coupling device for said coaxial circuit sections comprising a slidable element conductively interconnecting the inner elements of said coaxial circuit sections, variable spacing means providing relative adjustment longitudinally of said coaxial circuit sections connecting said mutual coupling device to said shorting rings, and single control means for simultaneously moving said shorting rings and said mutual coupling device to tune said broad band tuned circuit.

2. A broad band tuned circuit comprising, a pair of coaxial circuit sections connected to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, conductive means within and spaced from said inner element supplying anode potential to said amplifier in one end of said inner element from the opposite end thereof, additional capacitor means connecting the grid of said amplifier tube to the outer element of said one coaxial circuit section, conductive shorting rings, one for each of said coaxial circuit sections, connected to move as a unit, a conductive mutual coupling device conductively connected to the inner element of each of said coaxial circuit sections for sliding contact therewith, variable spacing means providing relative adjustment longitudinally of said coaxial circuit sections connecting said mutual coupling device to said shorting rings, and a single tuning control for simultaneously moving said shorting rings and said mutual coupling device to tune said broad band circuit.

3. A broad band tuned circuit comprising, two tunable coaxial circuit sections adjacent one another, means for supporting an amplifier tube in the upper end of the inner coaxial element of one of said sections, an adjustable shorting ring for the inner and outer elements of each of said coaxial circuit sections, the outer element of each of said coaxial circuit sections being slit longitudinally thereof nearest the other said outer element forming an opening communicating with the interior of each, said shorting rings connected together to move as a unit by means extending through said opening, an adjustable mutual coupling device for said coaxial circuit sections comprising a slidable conductive element interconnecting the inner elements of said coaxial circuit sections, variable spacing means providing relative adjustment longitudinally of said coaxial circuit sections connecting said mutual coupling device to said shorting rings, and single control means for simultaneously moving said shorting rings and said mutual coupling device to tune said broad band tuned circuit.

4. A broad band tuned circuit comprising, a pair of coaxial circuit sections connected to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, conductive means within and spaced from said inner element supplying anode potential to said amplifier in one end of said inner element from the opposite end thereof, additional capacitor means connecting the grid of said amplifier tube to the outer element of said one coaxial circuit section, the outer element of each of said coaxial circuit sections being slit longitudinally thereof adjacent its connection with the other said outer element forming an opening communicating with the interior of each, conductive shorting rings, one for each of said coaxial circuit sections, connected by means extending through said opening to move as a unit, a mutual coupling device conductively connected to the inner element of each of said coaxial circuit sections for sliding contact therewith, variable spacing means providing relative adjustment longitudinally of said coaxial circuit sections connecting said mutual coupling device to said shorting rings, and a single tuning control for simultaneously moving said shorting rings and said mutual coupling device to tune said broad band circuit.

5. A broad band tuned circuit comprising, a pair of coaxial circuit sections adjacent to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, conductive means within and spaced from said inner element supplying anode potential to said amplifier in one end of said inner element from the opposite end thereof, additional capacitor means to connect the grid of said amplifier tube to the outer element of said one coaxial circuit section, conductive shorting rings, one for each of said coaxial circuit sections, connected to move as a unit, a mutual coupling device conductively connected to the inner element of each of said coaxial circuit sections for sliding contact therewith, variable spacing means connecting said mutual coupling device to said shorting rings, a single tuning control for simultaneously moving said shorting rings and said mutual coupling device to tune said broad band circuit, the inner element of the other of said coaxial circuit sections being connected to the outer conductor thereof by inductance means and variable capacitive means connected in series, the series combination causing said pair of coaxial circuit sections to track when said inductance means and said variable capacitive means are adjusted equal respectively to the series grid inductance and the grid to plate capacity of said amplifier tube.

6. A broad band tuned circuit for a grounded grid amplifier comprising, two tunable coaxial circuit sections adjacent one another, means for supporting an amplifier tube in the upper end of the inner coaxial element of one of said sections, means connecting the grid of said tube to the outer element of said one of said coaxial circuit sections for radio frequencies, an adjustable shorting ring for the inner and outer elements of each of said coaxial circuit sections, said shorting rings connected together to move as a unit, an adjustable mutual coupling device for said coaxial circuit sections comprising a slidable conductive element interconnecting the inner elements of said coaxial circuit sections, variable spacing means providing relative adjustment longitudinally of said coaxial circuit sections connecting said mutual coupling device to said shorting rings, and single control means for simultaneously moving said shorting rings and said mutual coupling device to tune said broad band tuned circuit.

7. A broad band tuned circuit comprising, a pair of coaxial circuit sections connected to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, the anode of said amplifier tube being shaped to provide between the inner conductive element of said one of said coaxial circuit sections and said anode a passageway for the flow of cooling air through the said inner element and around said vacuum tube, conductive means within and spaced from said inner element supplying anode potential to said amplifier in one end of said inner element from the opposite end thereof, additional capacitor means connecting the grid of said amplifier tube to the outer element of said one coaxial circuit section, conductive shorting rings, one for each of said coaxial circuit sections, said shorting rings connected to move as a unit, a conductive mutual coupling device conductively connected to the inner element of each of said coaxial circuit sections for sliding contact therewith, variable spacing means providing relative adjustment longitudinally of said coaxial circuit sections connecting said mutual coupling device to said shorting rings, and a single tuning control for simultaneously moving said shorting rings and said mutual coupling device to tune said broad band circuit.

8. A broad band tuned circuit comprising, a pair of coaxial circuit sections connected to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, conductive means within and spaced from said inner element supplying anode potential to said amplifier in one end of said inner element from the opposite end thereof, additional capacitor means connecting the grid of said amplifier tube to the outer element of said one coaxial circuit section, conductive shorting rings, one for each of said coaxial circuit sections, said shorting rings connected to move as a unit, a mutual coupling device conductively connected to the inner element of each of said coaxial circuit sections for sliding contact therewith, variable spacing means providing relative adjustment longitudinally of said coaxial circuit sections connecting said mutual coupling device to said shorting rings, input means to drive the cathode of said vacuum tube and output means comprising a radio frequency transmission line located within the tubular inner conductor of the other of said coaxial circuit sections and extending outwardly through the open lower end thereof, one conductor of said transmission line being conductively connected to said tubular inner conductor at the top thereof, the other conductor of said transmission line being connected by capacitive means to the outer conductor of the other of said coaxial circuit sections at the top thereof.

9. A broad band tuned circuit comprising, a pair of coaxial circuit sections connected to one another, the inner element of one of said coaxial circuit sections being of hollow cylindrical shape, an amplifier tube, mounting means in one end of said inner element to support said amplifier tube therein, said mounting means including capacitor means connecting the anode of said amplifier tube to said inner element for high frequencies, conductive means within and spaced from said inner element supplying anode potential to said amplifier in one end of said inner element from the opposite end thereof, conductive shorting rings, one for each of said coaxial circuit sections, connected to move as a unit, a mutual coupling device conductively connected to the inner element of each of said coaxial circuit sections for sliding contact therewith, variable spacing means providing relative adjustment longitudinally of said coaxial circuit sections connecting said mutual coupling device to said shorting rings, input means to drive said vacuum tube and output means comprising a radio frequency transmission line located within the tubular inner conductor of the other of said coaxial circuit sections and extending outwardly through the open lower end thereof, one conductor of said transmission line being conductively connected to said tubular inner conductor at the top thereof, the other conductor of said transmission line being connected by capacitive means to the outer conductor of the other of said coaxial circuit sections at the top thereof.

10. The device according to claim 5 wherein said inductance means is conductively connected to the upper end of the inner conductor of the other of said coaxial circuit sections and supports one plate of said variable capacitive means, the other plate of said variable capacitive means being conductively connected to the outer element of the other of said coaxial circuit sections.

11. The device according to claim 5 wherein said inductance means has a preselected inductive value, said inductance means being conductively connected at one end thereof to the upper end of the inner element of the other of said coaxial circuit sections and extending through an aperture in the outer element of the other of said coaxial circuit sections, said inductance means supporting the fixed plate of said variable capacitive means at the other end thereof, the movable plate of said variable capacitive means being conductively connected to and located exteriorly of the outer element of the other of said coaxial circuit sections.

12. A broad band tuned circuit comprising primary and secondary coaxial circuit sections adjacent one another, the inner conductor of said primary coaxial circuit section being of hollow cylindrical shape, an amplifier tube, mounting means in one end of said inner conductor supporting said amplifier tube therein, said mounting means including capacitor means connecting the anode of said amplifier tube to said inner element for radio frequencies, the anode of said amplifier tube being shaped to provide between the inner conductor of said primary coaxial circuit section and said anode a passageway for the flow of cooling air through the said inner conductor and around said vacuum tube, conductive means within and spaced from said inner conductor supplying anode potential to said amplifier in one end of said inner conductor from the opposite end thereof, conductive shorting rings, one for each of said primary and secondary coaxial circuit sections, connected together to move as a unit, a mutual coupling device conductively connected to the inner conductor of each of said primary and secondary coaxial circuit sections for sliding contact therewith, adjustable spacing means connecting said mutual coupling device to said shorting rings, a single tuning control simultaneously moving said shorting bars and said mutual coupling device to tune said broad band circuit, input means to drive the control element of said vacuum tube and output means for said broad band tuned circuit, said output means comprising a radio frequency transmission line located within the tubular inner conductor of the secondary coaxial circuit section and extending outwardly through the open lower end thereof, one conductor of said transmission line being conductively connected to the last said tubular inner conductor at the top thereof, the other conductor of said transmission line being connected by capacitive means to the outer conductor of said secondary coaxial circuit section at the top thereof, the inner conductor of the secondary coaxial circuit section being connected to the outer conductor thereof by inductive means and variable capacitive means in series, the series combination causing said primary and secondary coaxial circuit sections to track when said inductance means and said variable capacitive means are adjusted equal respectively to the series grid inductance and the grid to plate capacity of said amplifier tube.

13. The device according to claim 12 wherein said inductance means is conductively connected to the upper end of the inner conductor of the other of said coaxial circuit sections and supports one plate of said variable capacitive means, the other plate of said variable capacitive means being conductively connected to the outer element of the other of said coaxial circuit sections.

14. The device according to claim 12 wherein said inductance means is adjustable by virtue of having a preselected inductive value, said inductance means being conductively connected at one end thereof to the upper end of the inner element of the other of said coaxial circuit sections and extending through an aperture in the outer element of the other of said coaxial circuit sections, said inductance means supporting the fixed plate of said variable capacitive means at the other end thereof, the movable plate of said variable capacitive means being conductively connected to and located exteriorly of the outer element of the other of said coaxial circuit sections.

15. The combination recited in claim 1 in which one of the said coaxial circuit sections is connected in the plate circuit of said amplifier tube.

16. The combination recited in claim 3 in which one of the said coaxial circuit sections is connected in the plate circuit of said amplifier tube.

17. The combination recited in claim 6 in which one of the said coaxial circuit sections is connected in the plate circuit of said amplifier tube.

References Cited in the file of this patent

UNITED STATES PATENTS

| | | |
|---|---|---|
| 2,161,646 | Weyers | June 6, 1939 |
| 2,336,498 | Minter | Dec. 14, 1943 |
| 2,412,805 | Ford | Dec. 17, 1946 |
| 2,425,454 | Block | Aug. 12, 1947 |
| 2,428,622 | Gurewitsch | Oct. 7, 1947 |
| 2,607,898 | Nelson | Aug. 19, 1952 |